United States Patent
Mao et al.

(10) Patent No.: US 9,631,787 B2
(45) Date of Patent: Apr. 25, 2017

(54) COVER MODULE FOR HOST AND ELECTRONIC DEVICE

(71) Applicant: WISTRON CORP., New Taipei (TW)

(72) Inventors: Zhong-Hui Mao, New Taipei (TW); Dong-Ying Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 113 days.

(21) Appl. No.: 14/164,194

(22) Filed: Jan. 25, 2014

(65) Prior Publication Data
US 2014/0293575 A1 Oct. 2, 2014

(30) Foreign Application Priority Data

Mar. 27, 2013 (CN) .......................... 2013 1 0102650

(51) Int. Cl.
*F21V 1/00* (2006.01)
*H05K 5/00* (2006.01)

(52) U.S. Cl.
CPC ............. *F21V 1/00* (2013.01); *H05K 5/0017* (2013.01)

(58) Field of Classification Search
CPC ........ F21V 1/00; H05K 5/0017; G01D 11/28; H01H 19/025; B60K 2350/203; B60K 2350/2039; B60K 2350/2043
USPC ........... 362/23.17, 23.16, 23.07, 23.09, 23.1, 362/23.11, 23.12, 23.18
See application file for complete search history.

(56) References Cited

U.S. PATENT DOCUMENTS

| | | | |
|---|---|---|---|
| 6,499,852 B1 * | 12/2002 | Kino ..................... | B60K 37/02 362/23.1 |
| 6,685,351 B2 * | 2/2004 | Chen ..................... | G08B 5/36 340/815.42 |
| 7,223,021 B2 | 5/2007 | Tung et al. | |
| 7,249,861 B2 * | 7/2007 | Coleman .............. | G06F 1/1662 200/314 |

(Continued)

FOREIGN PATENT DOCUMENTS

| | | |
|---|---|---|
| TW | M282208 | 12/2005 |
| TW | I301569 | 10/2008 |
| TW | 201134341 A1 | 10/2011 |

OTHER PUBLICATIONS

Taiwan Patent Office, Office action issued on Mar. 26, 2015.
China Patent Office, Office action issued on Oct. 10, 2016.

*Primary Examiner* — David V Bruce
(74) *Attorney, Agent, or Firm* — Li & Cai Intellectual Property (USA) Office

(57) ABSTRACT

An electronic device includes a cover module and a host having a lighting unit. The cover module has a light permeable cover, a system signal indicator, and a transmission unit. The cover has an outer surface, an opposite inner surface, and a fixing structure extended from the inner surface. The system signal indicator has a transparent portion having a plurality of indicating icons and an opaque portion. The transmission unit is fixed on the fixing structure, and the system signal indicator is sandwiched between the transmission unit and the inner surface. The cover module is installed on the host, and the transmission unit is aligned with the lighting unit. Thus, the transmission unit is used for transmitting light, emitted from the lighting unit, to the outer surface via the system signal indicator and the inner surface in turn, for showing the indicating icons on the outer surface.

16 Claims, 9 Drawing Sheets

(56) References Cited

U.S. PATENT DOCUMENTS

| | | | | |
|---|---|---|---|---|
| 7,527,386 B1* | 5/2009 | Salinas Fox | ........... | G01D 11/28 |
| | | | | 362/23.18 |
| 8,485,709 B2* | 7/2013 | Wan | ................... | A47L 15/4293 |
| | | | | 362/23.01 |
| 9,004,708 B2* | 4/2015 | Hayden, Sr. | ........ | F21V 33/0052 |
| | | | | 362/558 |
| 2005/0168954 A1* | 8/2005 | Kim | ................. | G02F 1/133308 |
| | | | | 361/725 |
| 2008/0282588 A1* | 11/2008 | Kimura | ................. | B60K 35/00 |
| | | | | 40/446 |
| 2013/0044459 A1* | 2/2013 | Miles | ................. | G09F 23/0058 |
| | | | | 362/85 |

* cited by examiner

COVER MODULE FOR HOST AND ELECTRONIC DEVICE

BACKGROUND OF THE DISCLOSURE

1. Field of the Disclosure

The instant disclosure relates to an electronic device; more particularly, to a cover module for a host and an electronic device, each having a cover formed without an indicating icon thereon.

2. Description of Related Art

The status indicating manner of a conventional electronic device is disclosed as follows: embedding at least one light guiding pillar in a cover and exposing the end surface of the light guiding pillar on the cover, in which a portion of the cover adjacent to the exposed surface of the light guiding pillar is printed or graved with a pattern or a symbol. Thus, when the light guiding pillar illuminates, a user can observe the pattern or symbol adjacent by the light guiding pillar, that is to say, the host is at a status shown by the pattern or symbol.

However, demanding for a better configuration continues to increase. The light guiding pillar only has a simple cross-sectional shape (e.g., circle or square) because of the mould factor. Specifically, the light guiding pillar cannot have a complex pattern or symbol by moulding, such that the cover needs to have an extra printing process for forming the pattern or symbol on the cover, thereby influencing the appearance of cover and increasing the cost and the failing probability of cover. Moreover, when different patterns are required, the covers must be processed respectively.

To achieve the abovementioned improvement, the inventors strive via industrial experience and academic research to present the instant disclosure, which can provide additional improvement as mentioned above.

SUMMARY OF THE DISCLOSURE

One embodiment of the instant disclosure provides a cover module for a host and an electronic device, which showing an indicating icon clearly without processing an outer surface of a cover thereof according to the indicating icon.

The electronic device comprises a cover module and a host. The cover module includes a light permeable cover, a system signal indicator, and a transmission unit. The light permeable cover has an outer surface, an opposite inner surface, and a fixing structure integrally extended from the inner surface. The system signal indicator has a transparent portion and an opaque portion surrounding the transparent portion, in which the transparent portion has a plurality of indicating icons. The transmission unit is fixed on the fixing structure of the cover, and the system signal indicator is sandwiched between the transmission unit and the inner surface of the cover. The host has a lighting unit. The cover module is installed on the host, and the lighting unit is aligned with the transmission unit. The lighting unit allows for emitting light to the cover module, and the cover module is configured to guide light generated from the lighting unit to pass through the transmission unit, the transparent portion of the system signal indicator, the inner surface of the cover, and the outer surface of the cover, thereby displaying at least one of the indicating icons on the outer surface.

The cover module for a host comprises a cover, a system signal indicator, and a transmission unit. The cover has an outer surface, an opposite inner surface, and a fixing structure integrally extended from the inner surface. The system signal indicator has a transparent portion and an opaque portion surrounding the transparent portion, in which the transparent portion has at least one indicating icon. The transmission unit is fixed on the fixing structure of the cover, and the system signal indicator is sandwiched between the transmission unit and the inner surface of the cover. The cover module is configured to guide light to pass through the transmission unit, the transparent portion of the system signal indicator, the inner surface of the cover, and the outer surface of the cover, thereby displaying at least one of the indicating icons on the outer surface.

In summary, the cover is formed without the pattern of the indicating icon thereon. Moreover, the system signal indicator can be replaced with a different pattern according to different demands of the indicating icons, so that the cover module of the instant disclosure is not produced such as the conventional cover.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
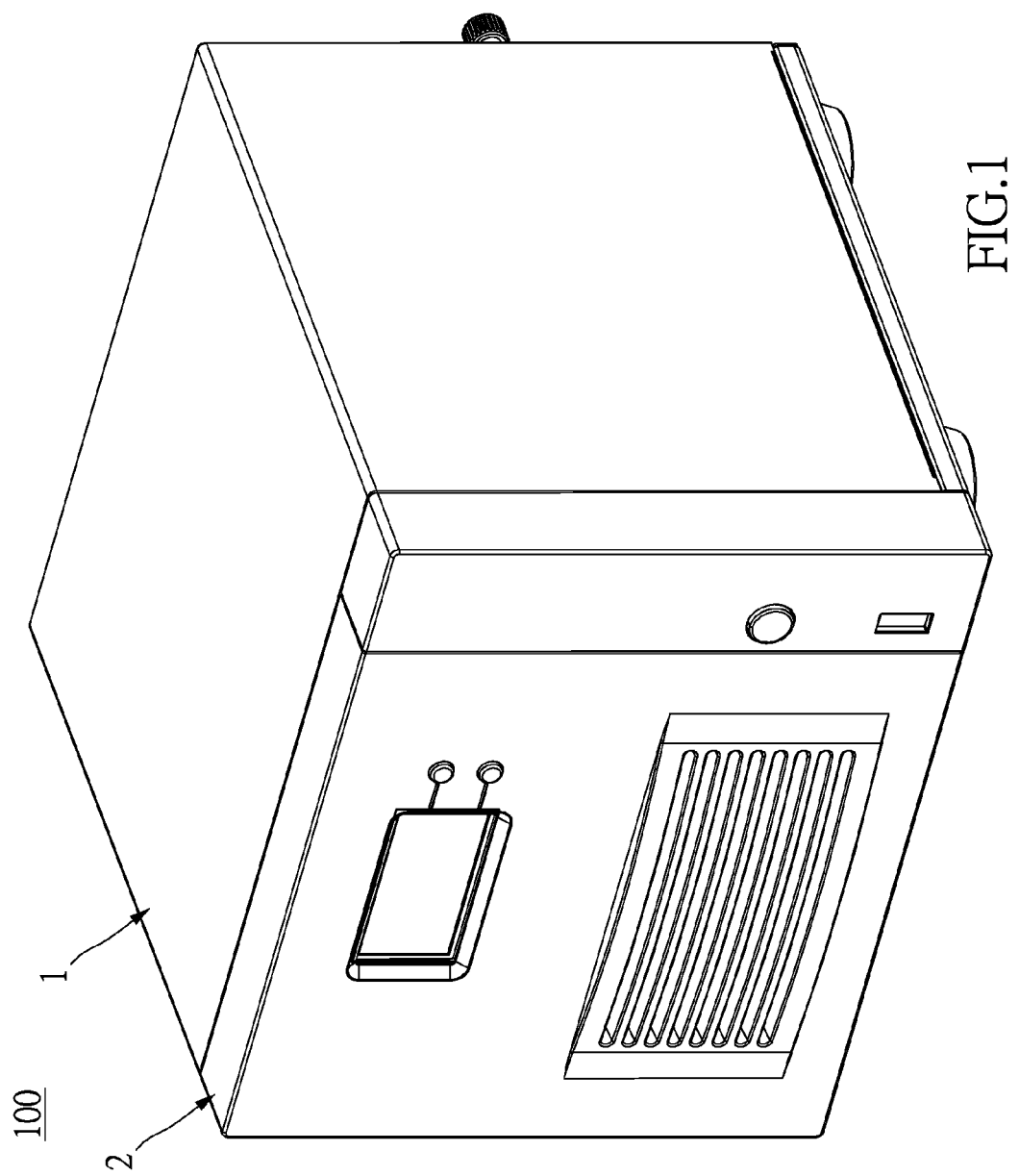
FIG. 1 is a perspective view of an electronic device according to the instant disclosure, when a lighting unit is off.

Please refer to FIG. 1, which shows a first embodiment of the instant disclosure. The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

The instant embodiment provides an electronic device 100 including a host 1 and a cover module 2 applied for the host 1. The cover module 2 is coupled to one side of the host 1. The following description discloses the construction of the host 1 and the cover module 2 firstly, and then discloses the relationship between the host 1 and the cover module 2.

Figure 2:
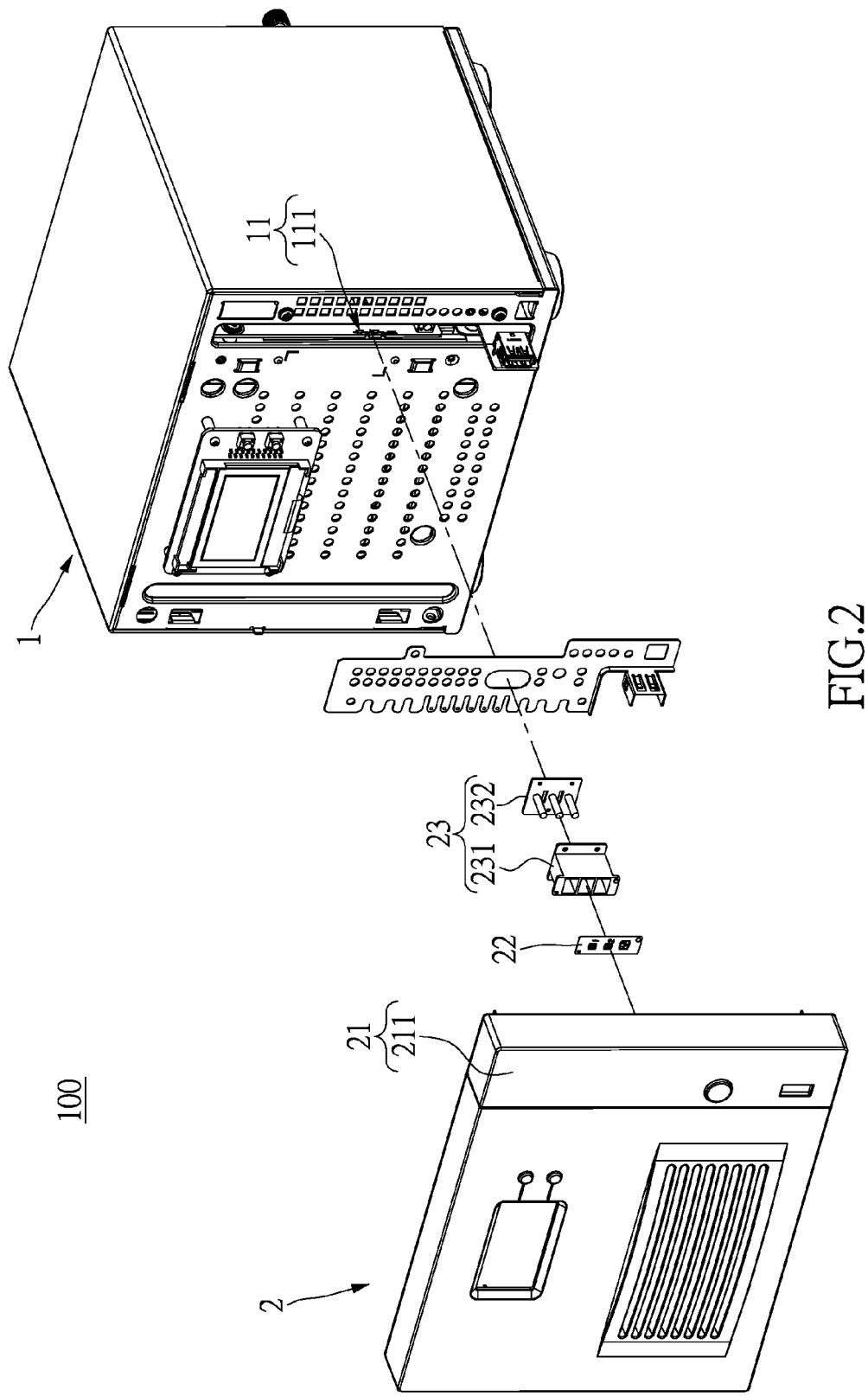
FIG. 2 is an exploded view of the electronic device according to the instant disclosure.
Figure 3:
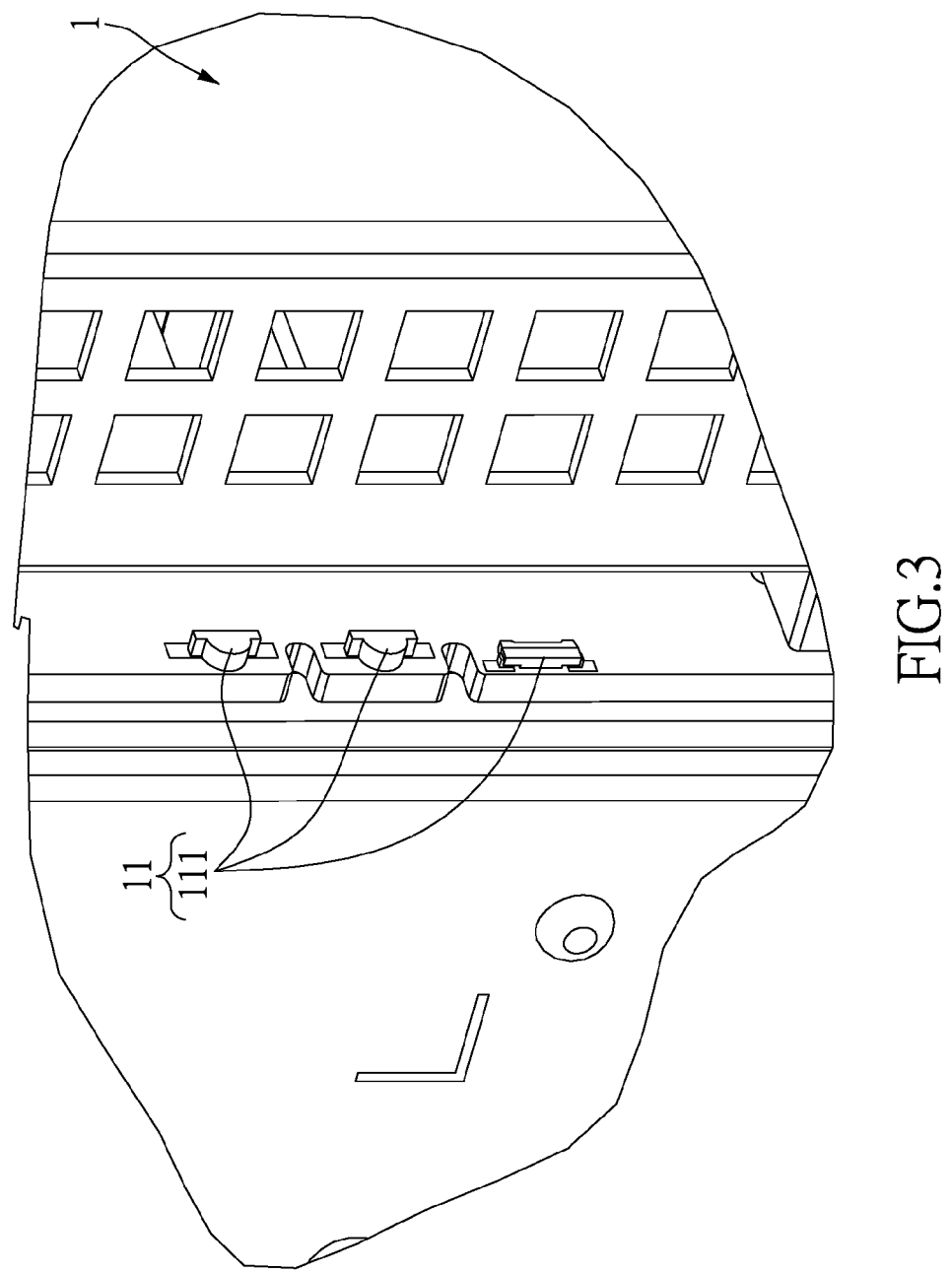
FIG. 3 is a partially enlarged view of a host of FIG. 2.

Please refer to FIGS. 2 and 3. The host 1 in the instant embodiment takes a computer server for example, but the instant disclosure is not limited thereto. The host 1 has a lighting unit 11 located corresponding to the cover module 2. The lighting unit 11 has three lighting elements 111 (e.g., LEDs) for emitting light toward the cover module 2.

The cover module 2 has a cover 21, a system signal indicator 22, and a transferring unit 23. The cover 21 is light permeable, that is to say, the cover 21 has a light transmittance more than 0%. The cover 21 in the instant embodiment takes a translucent cover 21 for example, but the cover 21 of the instant disclosure is not limited to the instant embodiment. The system signal indicator 22 and the transmission unit 23 are installed on an inside portion of the translucent cover 21. The translucent cover 21 is installed on the host 1, and the system signal indicator 22 and the transmission unit 23 are arranged in a space, which is jointly defined by the translucent cover 21 and the host 1. Two opposite ends of the transmission unit 23 are respectively aligned with the system signal indicator 22 and the lighting unit 11.

Figure 4:
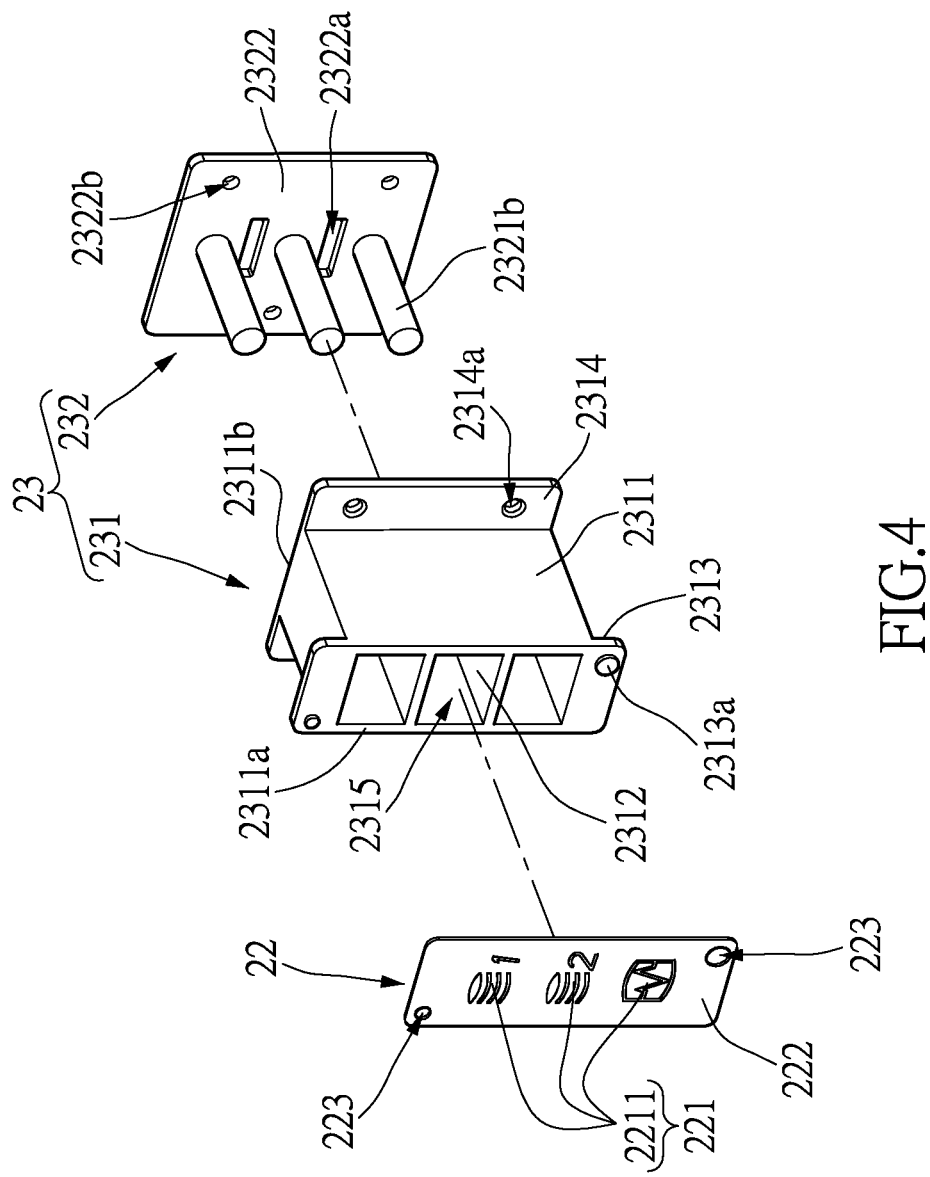
FIG. 4 is a partially enlarged view of a cover module of FIG. 2.
Figure 5:
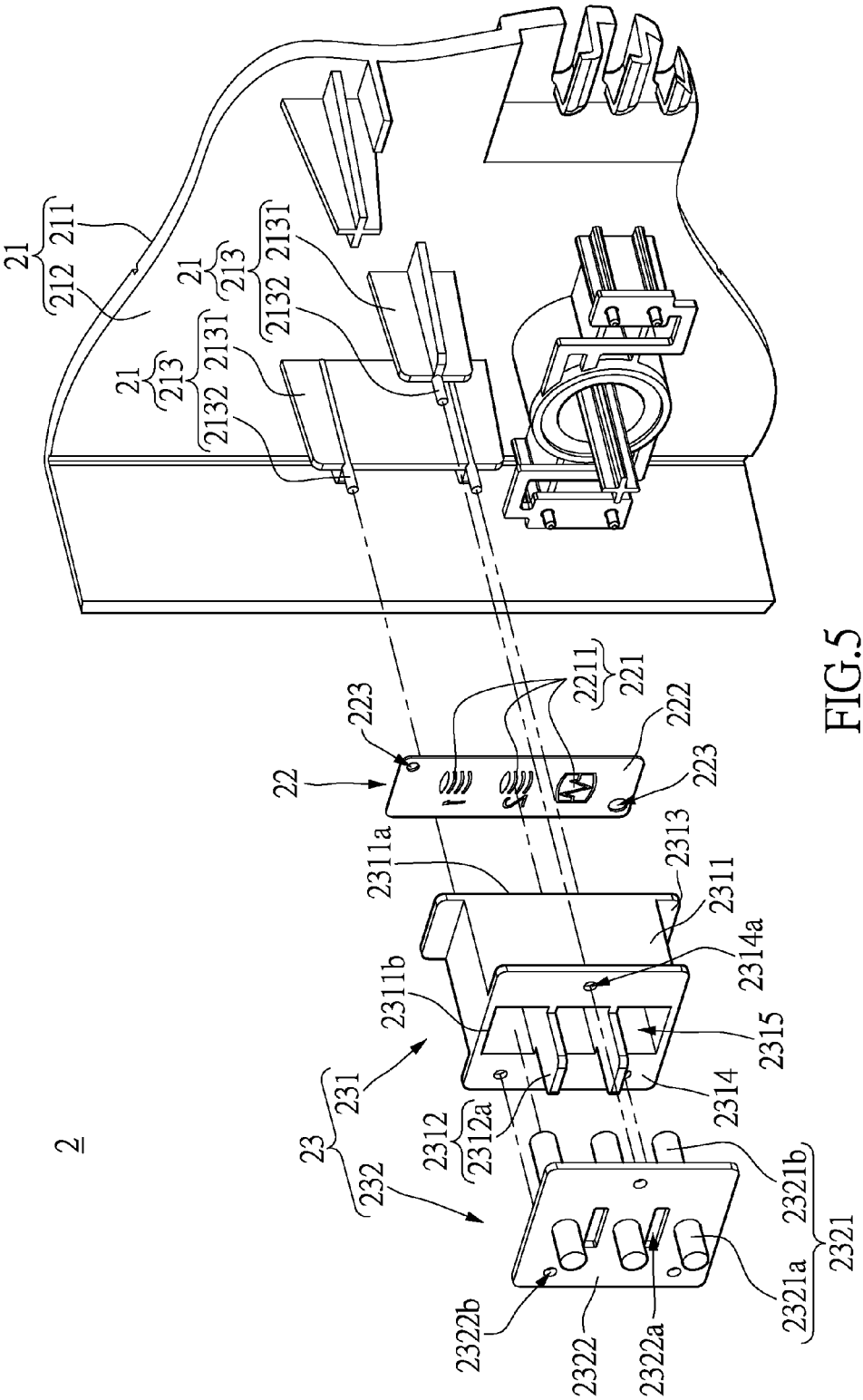
FIG. 5 is a partially enlarged view from another viewing angle of FIG. 2.
Figure 6:
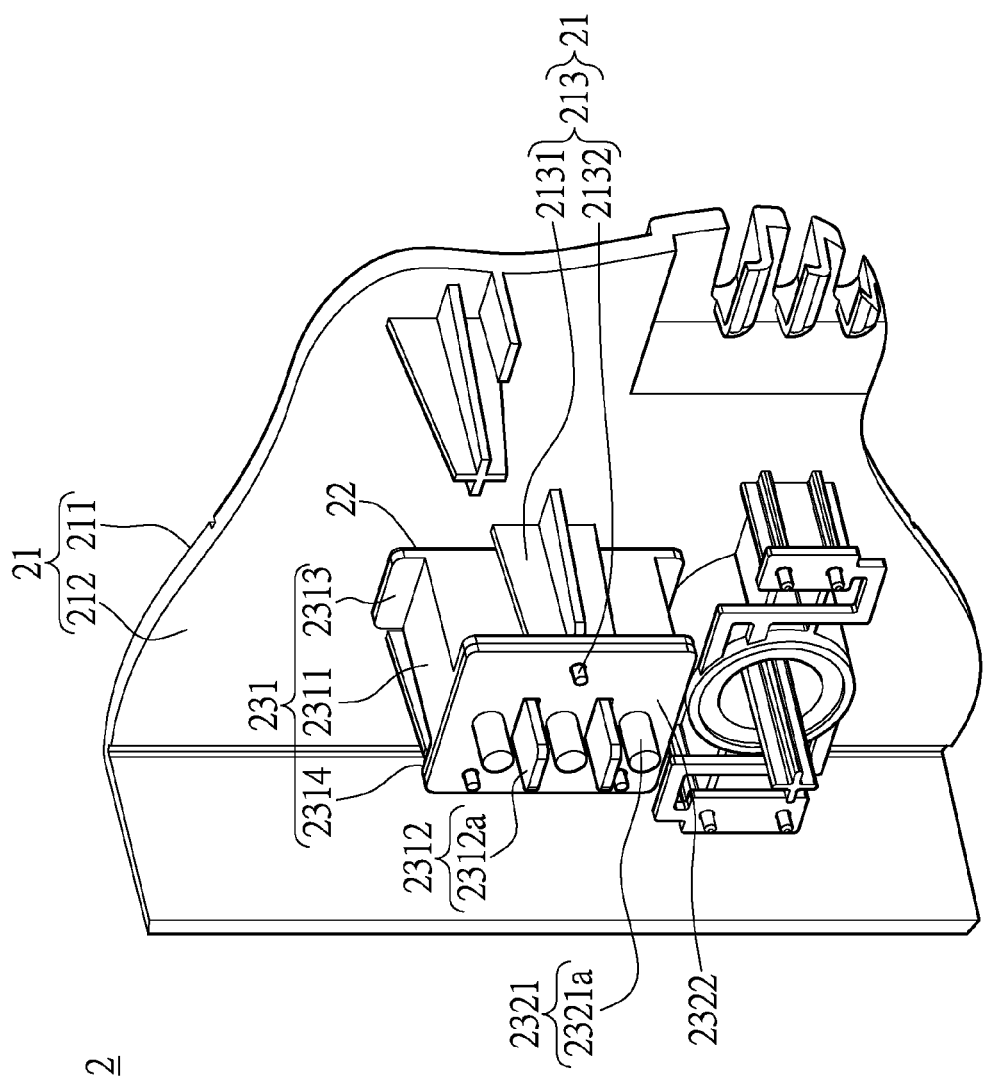
FIG. 6 is a combinative view of FIG. 5.

Please refer to FIGS. 4 through 6. The translucent cover 21 has an outer surface 211, an opposite inner surface 212, and a fixing structure 213 integrally extended from the inner surface 212. Specifically, an orthographic projection portion of the outer surface 211, which is defined by projecting of the system signal indicator 22, is a smooth surface. That is to say, the orthographic projection portion of the outer surface 211 does not have any decoration (i.e., opening or concave structure), and the outer surface 211 resembles a mirror. The fixing structure 213 has two supporting pillars 2131 and three fixing pillars 2132. The supporting pillars 2131 are integrally extended from the inner surface 212, and the fixing pillars 2132 are integrally extended from the end surface of the supporting pillars 2131. The cross-section of each fixing pillar 2132 is smaller than the cross-section of each supporting pillar 2131. The supporting pillars 2131 define a space, which is large enough to receive the system signal indicator 22 and the transmission unit 23.

Specifically, "translucent" is a conventional word in the industry, and the word "translucent" in the instant disclosure is defined herein. When light emits from the lighting elements 111, the light goes through the inner surface 212 to the outer surface 211 for allowing the user to observe, but the user cannot see the interior of the host 1 from the outer surface 211 of the translucent cover 21. When the lighting elements 111 are not lit, the outer surface 211 of the translucent cover 21 shows as a mirror, and the user cannot see the interior of the host 1 from the outer surface 211 of the translucent cover 21.

The system signal indicator 22 is a substantially rectangular sheet, and the system signal indicator 22 has a transparent portion 221 and an opaque portion 222 surrounding the transparent portion 221, in which the opaque portion 222 has three indicating icons 2211. For example, the system signal indicator 22 can be a transparent sheet. The ink is coating on a portion of the transparent sheet, the coated portion is the opaque portion 222, and the other uncoated portion is the transparent portion 221 (e.g., indicating icons 2211). Or, the system signal indicator 22 can be an opaque sheet. A portion of the opaque sheet is graved to form the transparent portion 221 (e.g., indicating icons 2211), and the other portion of the opaque plate is the opaque portion 222. Moreover, two opposite end portions of the system signal indicator 22 have a foolproof opening 223 respectively, and the sizes of the foolproof openings 223 are different.

The transmission unit 23 has a shading element 231 and a light guiding element 232 disposed on the shading element 231. The light guiding element 232 and the shading element 231 are fixed on the fixing structure 213 of the translucent cover 21 for sandwiched the system signal indicator 22 between the shading element 231 of the transmission unit 23 and the inner surface 212 of the translucent cover 21. The following description discloses the shading element 231 and the light guiding element 232 firstly, and then discloses the relationship between the transmission unit 23 and the other elements.

The shading element 231 is integrally formed and includes a tubular frame 2311 having a rectangular cross-section, two partitions 2312, two first flanges 2313, and two second flanges 2314. Two opposite ends of the frame 2311 are defined as a first end 2311a and a second end 2311b. The partitions 2312 are spacedly disposed in the frame 2311, so that the space surrounded by the frame 2311 is separated into three channels 2315 according to the partitions 2312. The other portion of each partition 2312 exposed from the frame 2311 is defined as a positioning portion 2312a. In other words, the majority of the partition 2312 is hidden inside the frame 2311, with the rest forming the positioning portion 2312a.

Moreover, the first flanges 2313 are extended from two opposite edges of the first end 2311a of the frame 2311 (the upper edge and the lower edge as shown in FIG. 5) respectively along two directions away from each other. Each first flange 2313 has a foolproof pillar 2313a, and the foolproof pillars 2313a respectively have two different sized cross-sections. The foolproof openings 223 respectively conform with the foolproof pillars 2313a. The second flanges 2314 are extended from two opposite edges of the second end 2311b of the frame 2311 (the left edge and the right edge as shown in FIG. 5) respectively along two directions away from each other. The extending direction of the second flanges 2314 is perpendicular to the extending direction of the first flanges 2313. The second flanges 2314 have three thru holes 2314a, and the position and the contour of the thru holes 2314a are respectively corresponding to the fixing pillars 2132.

The light guiding element 232 has three cylindrical light guiding pillars 2321 and a connecting plate 2322 integrally connected to the light guiding pillars 2321. The light guiding pillars 2321 are parallel to each other, and the longitudinal direction of each light guiding pillar 2321 is perpendicular to the connecting plate 2322. Each light guiding pillar 2321 has a front light guiding portion 2321a and a rear light guiding portion 2321b, which are respectively arranged on two opposite sides of the connecting plate 2322 (i.e., the left side and the right side as shown in FIG. 5).

Each front light guiding portion 2321a has a concave surface formed on the end thereof for collecting light, and each rear light guiding portion 2321b has a convex surface for emitting light uniformly. The connecting plate 2322 has two positioning opening 2322a each arranged between any two adjacent light guiding pillars 2321, and the contour of each positioning opening 2322a is corresponding to the cross-section of each positioning portion 2312a. The connecting plate 2322 has three thru holes 2322b respectively corresponding to the fixing pillars 2312 in shape and position.

Specifically, the rear light guiding portions 2321b are respectively arranged in the channels 2315, the positioning portions 2312a respectively couple through the positioning openings 2322a, and each positioning portion 2312a is located between any two adjacent front light guiding portions 2321a. The connecting plate 2322 is disposed on the second end 2311b and the second flanges 2314, and the position of the thru holes 2322b of the connecting plate 2322 are respectively corresponding to the thru holes 2314a of the shading element 231.

The system signal indicator 22 is fixed on (e.g., adhere to) the first end 2311a of the frame 2311 and the first flanges 2313, and the foolproof pillars 2313a are respectively coupled through the foolproof openings 223 for preventing the system signal indicator 22 from wrong installing direction with respect to the shading element 231. Two ends of each channel 2315 are respectively aligned with the corresponding indicating icon 2211 and the corresponding lighting element 111. Moreover, one end of each light guiding pillar 2321 (e.g., the end of each front light guiding portion 2321a) is aligned with the corresponding lighting element 111 for receiving light generated from the corresponding lighting element 111. The other end of each light guiding pillar 2321 (i.e., the end of each rear light guiding portion 2321b) is aligned with the corresponding indicating icon 2211 in a predetermined distance for uniformly illuminating the corresponding indicating icon 2211.

Specifically, the combination of the system signal element 22, the shading element 231, and the light guiding element 232 is approximately arranged within the space defined by the supporting pillars 2131, and a surface of the system signal element 22 away from the light guiding element 232 contacts the inner surface 212 of the translucent cover 21. The second flanges 2314 of the shading element 231 abut against the end of the supporting pillars 2131, and each fixing pillar 2132 couples through the corresponding thru hole 2314a of the second flanges 2314 and the corresponding thru hole 2322b of the connecting plate 2322.

Additionally, the instant embodiment discloses the combination of the system signal element 22, the shading element 231, and the light guiding element 232 on the translucent cover 21 firmly by welding a portion of each fixing pillar 2132, which passes through the corresponding thru hole 2322b of the connecting plate 2322, but the instant disclosure is not limited to the welding manner. For example, the outer surface of each fixing pillar 2132 can be formed with threads, and the corresponding nut mate the threaded portion of each fixing pillar 2132, which passes through the corresponding thru hole 2322b of the connecting plate 2322.

Figure 7:
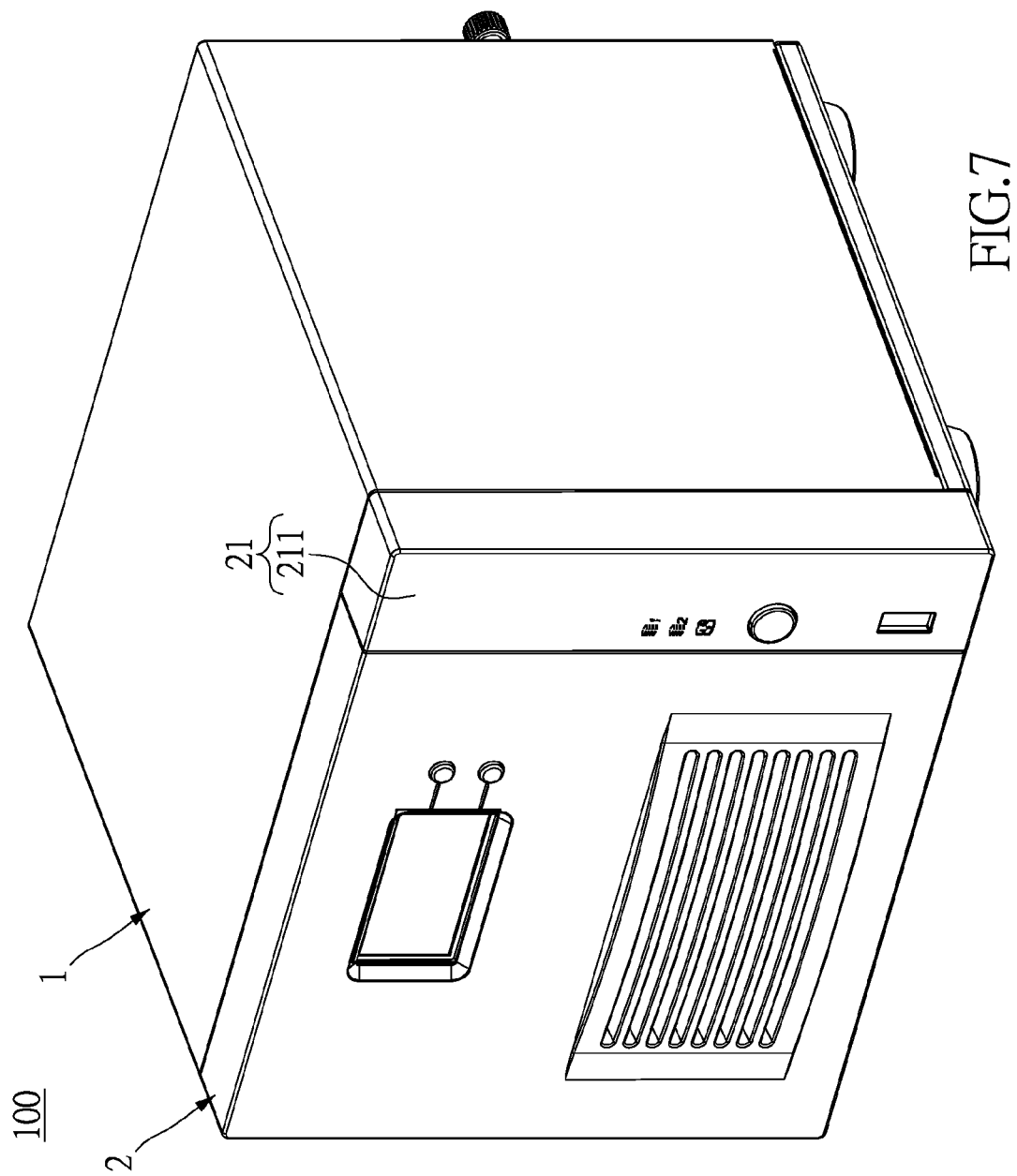
FIG. 7 is a perspective view of the electronic device according to the instant disclosure, when the lighting unit emits light.
Figure 8:
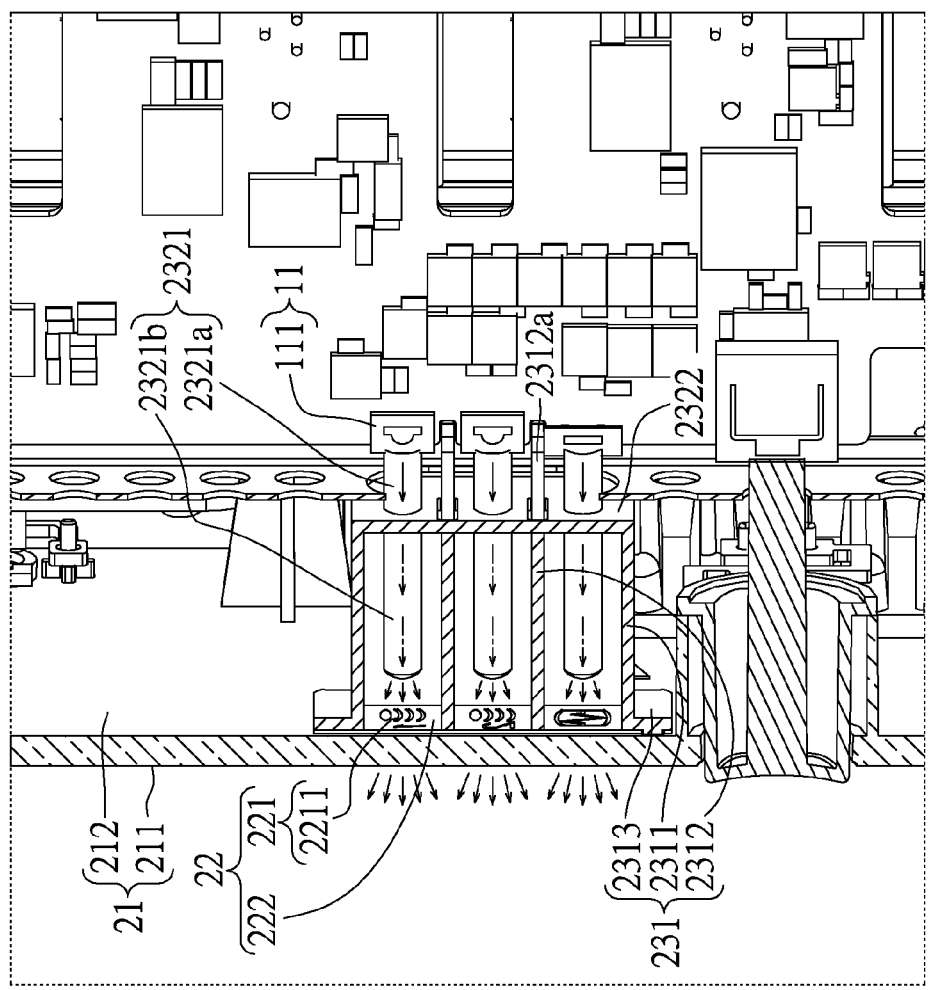
FIG. 8 is a cross-sectional view of FIG. 7.

Please refer to FIGS. 7 and 8, which show the electronic device 100 according to the instant disclosure. The lighting elements 111 of the lighting unit 11 emits light to the system signal indicator 22 via the light guiding pillars 2321 of the transmission unit 231. During the light transmitting process, the front light guiding portions 2321a are separated and shielded by the positioning portions 2312a of the partitions 2312, and the rear light guiding portions 2321b are separated and shielded by the portions of the partitions 2312 arranged in the frame 2311, such that light emitted from the lighting elements 111 are respectively transmitted in the channels 2315 without interfering each other. Moreover, the light goes through the light guiding pillars 2321, emits out of the end of the rear light guiding portions 2321b to uniformly disperse on the system signal indicator 22, and then passes through the indicating icons 2211, the inner surface 212, and the outer surface 211 for showing the corresponding indicating icons 2211.

Thus, as shown in FIG. 1, when the lighting unit 11 is not lit (or the electronic device 100 is not operated), the outer surface 211 of the translucent cover 21 of the electronic device 100 is flash, and the user cannot see the interior of the host 1. As shown in FIG. 7, when the lighting unit 11 is lit (or the electronic device 100 is under operation), the outer surface 211 of the translucent cover 21 of the electronic device 100 shows at least one indicating icon 211 for providing the instant status information of the electronic device 100 to the user.

Moreover, in another embodiment, the transmission unit 23 may have the shading element 231, and light emitting from each lighting element 111 passes through the corresponding channel 2315 of the shading element 231 to the system signal indicator 22. Additionally, the transmission unit 23 can just have the light guiding element 232, and the outer surface of the light guiding element 232 is coated with a light reflection layer, such that light emitting from each lighting element 111 goes through the light guiding element 232 to the system signal indicator 22.

Figure 9:
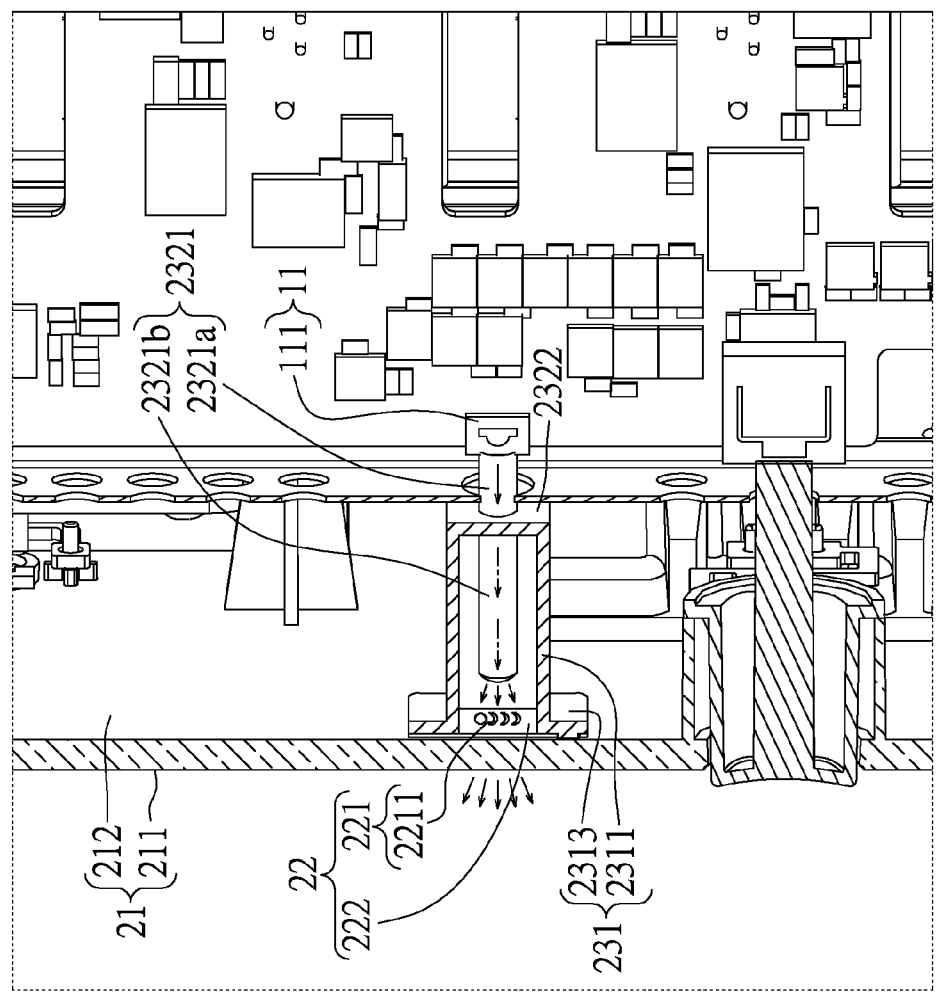
FIG. 9 is a cross-sectional view of another embodiment of the electronic device according to the instant disclosure.

Please refer to FIG. 9, which shows a second embodiment of the instant disclosure. The instant embodiment is similar to the first embodiment, and the difference between the embodiments is described herein. The system signal indicator 22 of the instant embodiment only has one indicating icon 2211, and the components corresponding to the system signal indicator 22 are accordingly adjusted. For example, the frame 2311 of the shading element 231 only has one channel 2321 and does not have any partition 2312, the light guiding element 232 only has one light guiding pillar 2321 and one connecting plate 2322, and the lighting unit 11 only has one lighting element 111. The other construction of the instant embodiment is similar to the first embodiment, and the specifics of the same are not described herein. Thus, according to the above embodiments, the number of the indicating icon 2211 and the corresponding component can be adjusted as desired.

Base on the above, the outer surface of the translucent cover is flash, such as a mirror, without any processing (e.g., engraving) for the indicating icon (decoration), by the structure design of the cover module. Moreover, the system signal indicator can be replaced with a different pattern according to the different demands of the indicating icons, so that the instant disclosure is not produced such as the conventional cover. Additionally, when the light guiding element is used for transmitting light, the adjacent light guiding pillars do not interfere to each other by disposing the shading element, in which the positioning portion of the shading element has multi-function, such as foolproof, light shading, and positioning.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:
1. An electronic device, comprising:
  a cover module, comprising:
    a translucent cover having an outer surface, an opposite inner surface, and a fixing structure integrally extended from the inner surface, and the outer surface resembles a mirror;
    a system signal indicator having a transparent portion and an opaque portion surrounding the transparent portion, wherein the transparent portion has a plurality of indicating icons; and
    a transmission unit fixed on the fixing structure of the translucent cover, and the system signal indicator sandwiched between the transmission unit and the inner surface of the translucent cover; and a host having a lighting unit, wherein the cover module is installed on the host, and the lighting unit is aligned with the transmission unit;

wherein a surface of the system signal element away from the transmission unit is adjacent to the inner surface of the translucent cover;

wherein a portion of the translucent cover corresponding to the system signal element is without any opening, thus the system signal element is covered by the portion of the translucent cover;

wherein the lighting unit allows for emitting light to the cover module, and the cover module is configured to guide light generated from the lighting unit to pass through the transmission unit, the transparent portion of the system signal indicator, the inner surface of the translucent cover, and the outer surface of the translucent cover, thereby displaying at least one of the indicating icons on the outer surface.

2. The electronic device as claimed in claim 1, wherein the lighting unit has a plurality of lighting elements, the transmission unit has a shading element defining a plurality of isolated channels, two ends of each channel are respectively aligned with the respective indicating icon and the respective lighting element, and the shading element is configured to separate light generated from the lighting elements for enabling light generated from the lighting elements respectively transmitted in the channels without interfering to each other.

3. The electronic device as claimed in claim 2, wherein the shading element has a tubular frame, at least one partition, and at least one first flange, two opposite ends of the frame are respectively defined as a first end and a second end, at least partial of the partition is disposed in the frame, the space surrounded by the frame is defined as the channels according to the separation of the partition, the first flange is integrally and outwardly extended from the first end of the frame, the system signal indicator is fixed on the first end of the frame and the first flange.

4. The electronic device as claimed in claim 3, wherein the number of the first flange is two, and the first flanges are extended from two opposite edges of the first end of the frame respectively in two directions away from each other, and each first flange has a foolproof pillar, and the foolproof pillars respectively have two different sized cross-sections, the system signal indicator has two foolproof openings respectively conforming with the foolproof pillars, and the foolproof pillars respectively couple through the foolproof openings.

5. The electronic device as claimed in claim 3, wherein the transmission unit has a light guiding element disposed on the shading element, the light guiding element has a plurality of light guiding pillars respectively passing through the channels, and one end of each light guiding pillar is aligned with the corresponding lighting element for receiving light generated from the corresponding lighting element, and the other end of each light guiding pillar is aligned with the corresponding indicating icon for showing the corresponding indicating icon by light emitting out of the corresponding indicating icon via the light guiding pillar.

6. The electronic device as claimed in claim 5, wherein the light guiding element has a connecting plate connecting to the light guiding pillars, and the connecting plate is disposed on the second end of the frame of the shading element and fixed on the fixing structure of the translucent cover.

7. The electronic device as claimed in claim 6, wherein each light guiding pillar has a front light guiding portion and a rear light guiding portion, are respectively arranged on two opposite sides of the connecting plate, the connecting plate has at least one positioning opening arranged between any two adjacent light guiding pillars, a portion of the partition exposed from the frame is defined as a positioning portion, and wherein the rear light guiding portions are respectively arranged in the channels, the positioning portion couples through the positioning opening, and the positioning portion is located between any two adjacent front light guiding portions.

8. The electronic device as claimed in claim 6, wherein the shading element has at least one second flange having a thru hole, the second flange is integrally and outwardly extended from the second end of the frame, the connecting plate has a thru hole, the fixing structure couples through the thru hole of the second flange and the thru hole of the connecting plate.

9. A cover module for a host, comprising:
a translucent cover having an outer surface, an opposite inner surface, and a fixing structure integrally extended from the inner surface, and the outer surface resembles a mirror;
a system signal indicator having a transparent portion and an opaque portion surrounding the transparent portion, wherein the transparent portion has at least one indicating icon; and
a transmission unit fixed on the fixing structure of the translucent cover, and the system signal indicator sandwiched between the transmission unit and the inner surface of the translucent cover; and
wherein a surface of the system signal element away from the transmission unit is adjacent to the inner surface of the translucent cover;
wherein a portion of the translucent cover corresponding to the system signal element is without any opening, thus the system signal element is covered by the portion of the translucent cover;
wherein the cover module is configured to guide light to pass through the transmission unit, the transparent portion of the system signal indicator, the inner surface of the translucent cover, and the outer surface of the translucent cover, thereby displaying at least one of the indicating icons on the outer surface.

10. The cover module as claimed in claim 9, wherein the transmission unit has a shading element defining at least one channel, one end of the channel is aligned with the respective indicating icon, and the shading element is configured to provide light to transmit in the channel, for preventing light leakage and interruption.

11. The cover module as claimed in claim 10, wherein the shading element has a tubular frame and at least one first flange, two opposite ends of the frame are respectively defined as a first end and a second end, the space surrounded by the frame is defined as the channel, the first flange is integrally and outwardly extended from the first end of the frame, the system signal indicator is fixed on the first end of the frame and the first flange.

12. The cover module as claimed in claim 11, wherein the number of the first flange is two, and the first flanges are extended from two opposite edges of the first end of the frame respectively in two directions away from each other, and each first flange has a foolproof pillar, and the foolproof pillars respectively have two different sized cross-sections, the system signal indicator has two foolproof openings respectively conforming with the foolproof pillars, and the foolproof pillars respectively couple through the foolproof openings.

13. The cover module as claimed in claim 11, wherein the transmission unit has a light guiding element disposed on the shading element, the light guiding element has at least one light guiding pillar passing through the channel, and one end of the light guiding pillar is configured to receive light, and the other end of the light guiding pillar is aligned with the corresponding indicating icon for showing the corresponding indicating icon by light emitting out of the corresponding indicating icon via the light guiding pillar.

14. The cover module as claimed in claim 13, wherein the light guiding element has a connecting plate connecting to the light guiding pillar, and the connecting plate is disposed on the second end of the frame of the shading element and fixed on the fixing structure of the translucent cover.

15. The cover module as claimed in claim 14, wherein the shading element has at least one second flange having a thru hole, the second flange is integrally and outwardly extended from the second end of the frame, the connecting plate has a thru hole, the fixing structure couples through the thru hole of the second flange and the thru hole of the connecting plate.

16. The cover module as claimed in claim 9, wherein the cover has a light transmittance more than 0%.

\* \* \* \* \*